United States Patent
Ke et al.

(10) Patent No.: US 11,854,873 B2
(45) Date of Patent: Dec. 26, 2023

(54) ETCH PROFILE CONTROL OF INTERCONNECT STRUCTURES

(71) Applicant: Taiwan Semiconductor Manufacturing Co., Ltd., Hsinchu (TW)

(72) Inventors: Yu Lun Ke, Hsinchu (TW); Yi-Wei Chiu, Kaohsiung (TW); Hung Jui Chang, Changhua County (TW); Yu-Wei Kuo, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 104 days.

(21) Appl. No.: 17/542,609

(22) Filed: Dec. 6, 2021

(65) Prior Publication Data

US 2022/0093457 A1    Mar. 24, 2022

Related U.S. Application Data

(60) Continuation of application No. 16/202,816, filed on Nov. 28, 2018, now Pat. No. 11,195,750, which is a division of application No. 15/725,972, filed on Oct. 5, 2017, now Pat. No. 10,707,123.

(60) Provisional application No. 62/491,646, filed on Apr. 28, 2017.

(51) Int. Cl.
| H01L 21/768 | (2006.01) |
| H01L 21/74  | (2006.01) |
| H01L 21/48  | (2006.01) |
| H01L 23/522 | (2006.01) |
| H01L 23/532 | (2006.01) |

(52) U.S. Cl.
CPC .... *H01L 21/76849* (2013.01); *H01L 21/4828* (2013.01); *H01L 21/743* (2013.01); *H01L 23/5226* (2013.01); *H01L 23/53295* (2013.01); *H01L 2224/05093* (2013.01)

(58) Field of Classification Search
None
See application file for complete search history.

(56) References Cited

U.S. PATENT DOCUMENTS

| 5,882,535 A | 3/1999 | Stocks et al. |
| 6,326,296 B1 | 12/2001 | Tsai et al. |
| 6,352,917 B1 | 3/2002 | Gupta et al. |
| 6,713,873 B1 | 3/2004 | O'Loughlin et al. |
| 9,502,350 B1 | 11/2016 | Bonilla et al. |
| 9,627,256 B2 | 4/2017 | Tsai et al. |
| 9,679,804 B1 | 6/2017 | Chen et al. |
| 10,090,242 B2 | 10/2018 | JangJian et al. |

(Continued)

FOREIGN PATENT DOCUMENTS

| DE | 102015107271 A1 | 4/2016 |
| KR | 10-2004-0108032 | 12/2004 |

*Primary Examiner* — Nilufa Rahim
(74) *Attorney, Agent, or Firm* — Sterne, Kessler, Goldstein & Fox P.L.L.C.

(57) ABSTRACT

A method of forming a semiconductor structure includes forming an etch stop layer on a substrate, forming a metal oxide layer over the etch stop layer, and forming an interlayer dielectric (ILD) layer on the metal oxide layer. The method further includes forming a trench etch opening over the ILD layer, forming a capping layer over the trench etch opening, and forming a via etch opening over the capping layer.

20 Claims, 7 Drawing Sheets

(56) References Cited

U.S. PATENT DOCUMENTS

| | | |
|---|---|---|
| 10,707,123 B2 | 7/2020 | Ke et al. |
| 11,195,750 B2 | 12/2021 | Ke et al. |
| 11,569,125 B2 | 1/2023 | Ke et al. |
| 2003/0003765 A1 | 1/2003 | Gibson, Jr. et al. |
| 2004/0101667 A1 | 5/2004 | O'Loughlin et al. |
| 2004/0166629 A1 | 8/2004 | Hilliger et al. |
| 2004/0175932 A1 | 9/2004 | Kim et al. |
| 2005/0001318 A1 | 1/2005 | Won |
| 2005/0067702 A1 | 3/2005 | America et al. |
| 2006/0205207 A1 | 9/2006 | Chen et al. |
| 2009/0102052 A1 | 4/2009 | Ryu |
| 2010/0055897 A1 | 3/2010 | Chou et al. |
| 2010/0279234 A1 | 11/2010 | Yu et al. |
| 2010/0308463 A1 | 12/2010 | Yu et al. |
| 2011/0155692 A1* | 6/2011 | Yau ............... H01L 21/31144 216/41 |
| 2013/0175629 A1 | 7/2013 | Chang |
| 2014/0342553 A1 | 11/2014 | Chen et al. |
| 2015/0097293 A1 | 4/2015 | Yao et al. |
| 2015/0200130 A1 | 7/2015 | Huang et al. |
| 2015/0221547 A1 | 8/2015 | Arnold et al. |
| 2016/0079115 A1* | 3/2016 | Lee ............... H01L 21/31144 438/637 |
| 2016/0111325 A1 | 4/2016 | JangJian et al. |
| 2016/0358851 A1 | 12/2016 | Singh et al. |
| 2016/0358854 A1 | 12/2016 | JangJian et al. |
| 2017/0018458 A1 | 1/2017 | Cheng et al. |
| 2017/0221999 A1 | 8/2017 | Dasgupta et al. |
| 2018/0061700 A1 | 3/2018 | Sun et al. |
| 2018/0226289 A1 | 8/2018 | Bielefeld et al. |
| 2018/0286867 A1* | 10/2018 | Chang ............... H01L 21/76843 |
| 2018/0315648 A1 | 11/2018 | Ke et al. |
| 2019/0096754 A1 | 3/2019 | Ke et al. |
| 2020/0328113 A1 | 10/2020 | Ke et al. |
| 2021/0313277 A1 | 10/2021 | Kudo et al. |

* cited by examiner

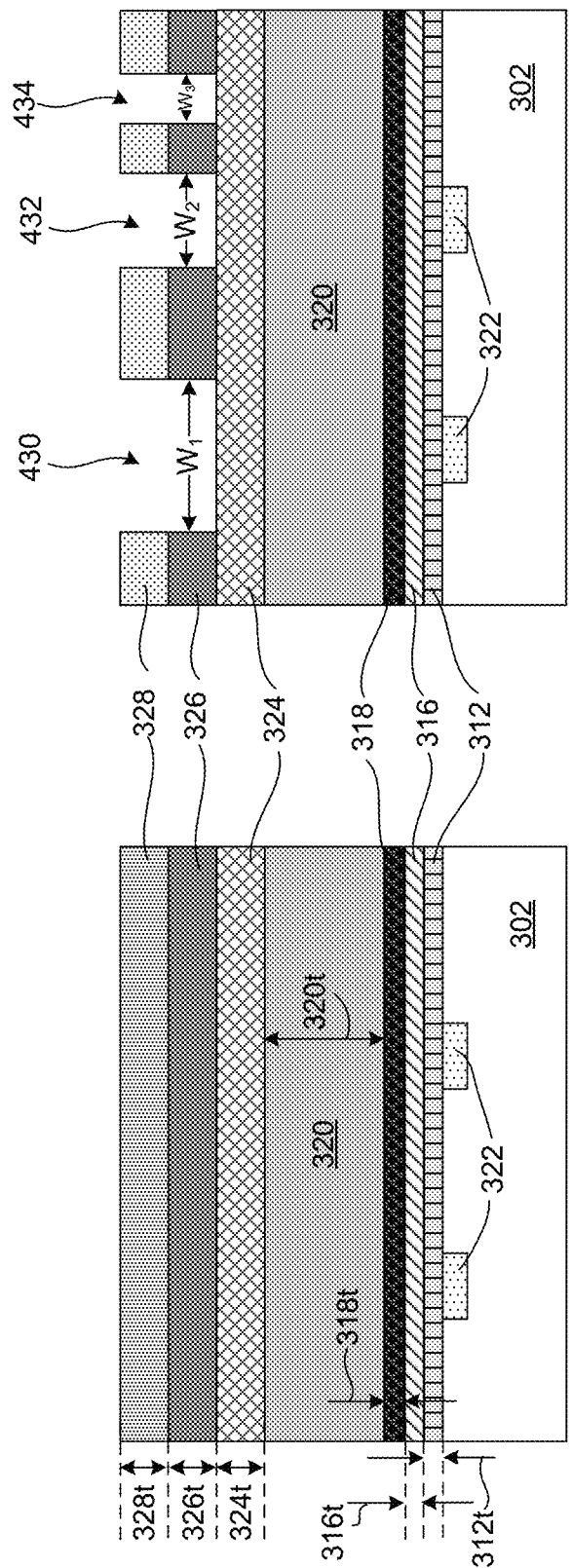

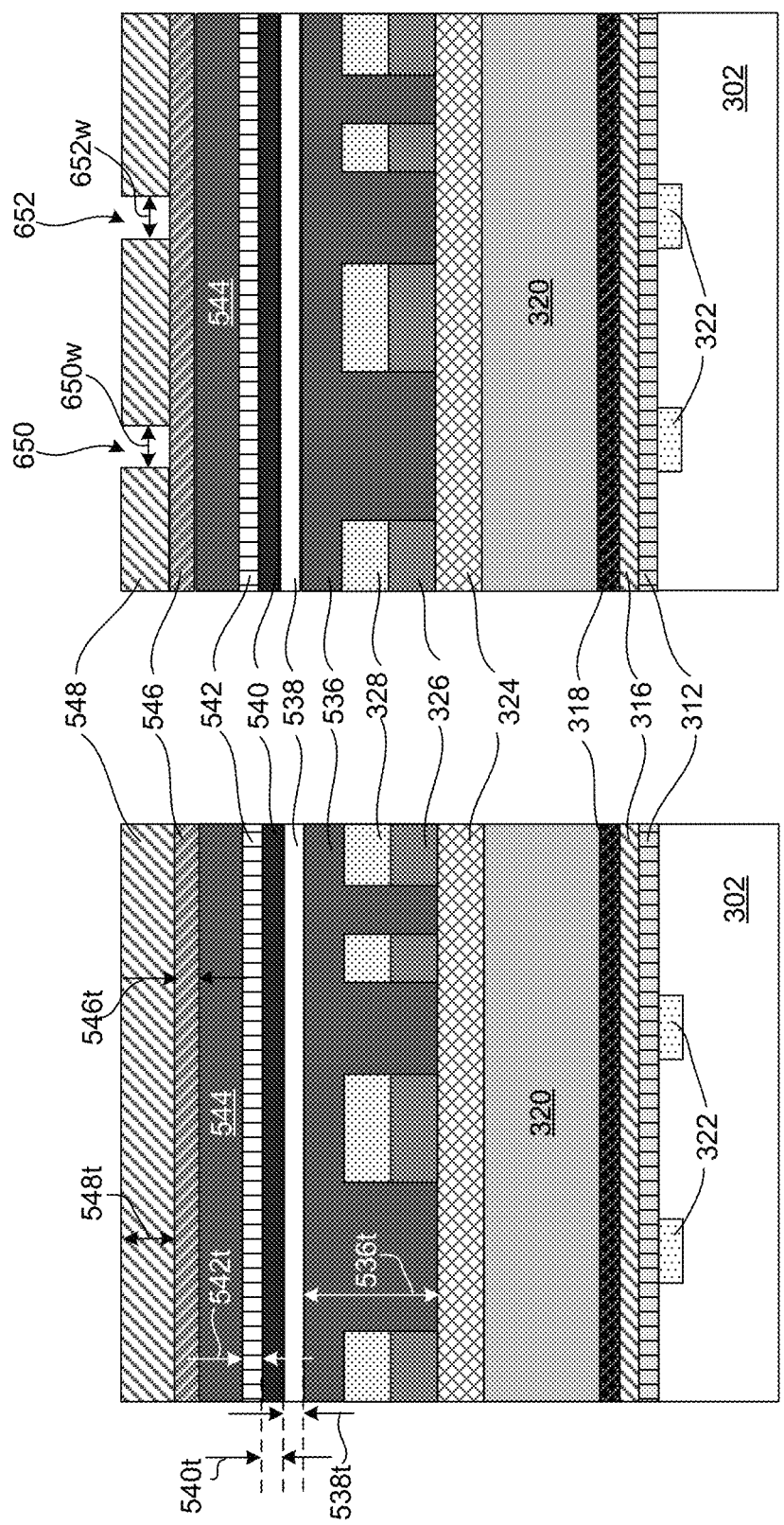

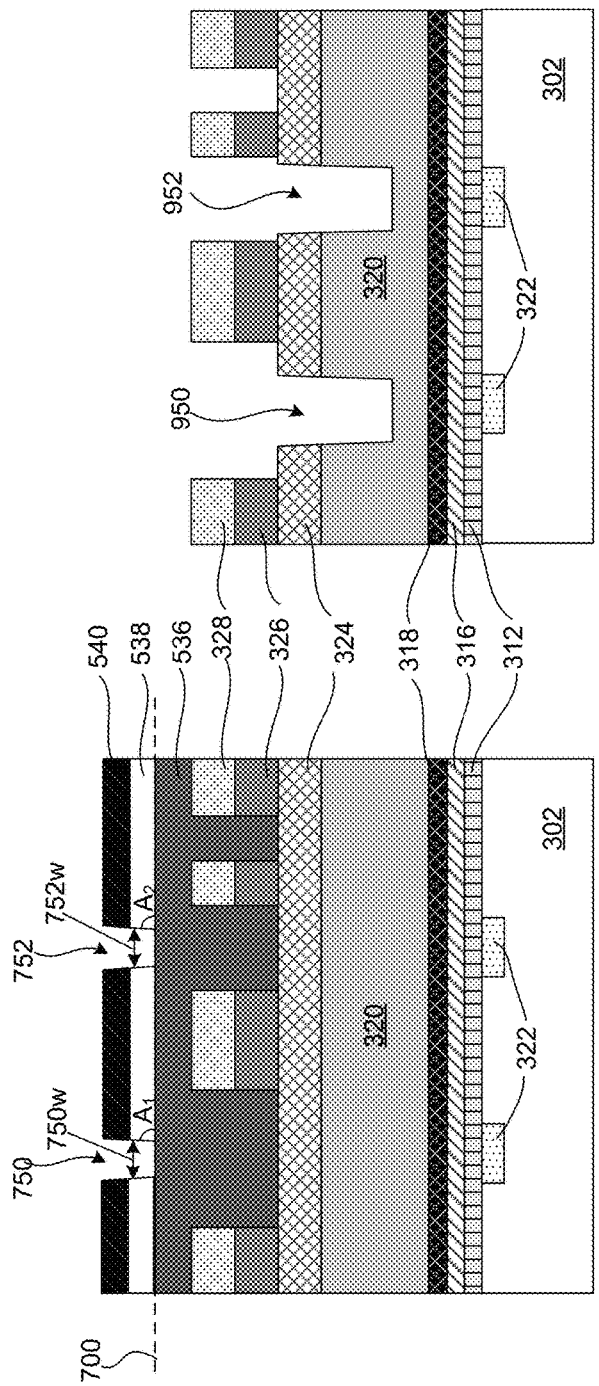
FIG. 7
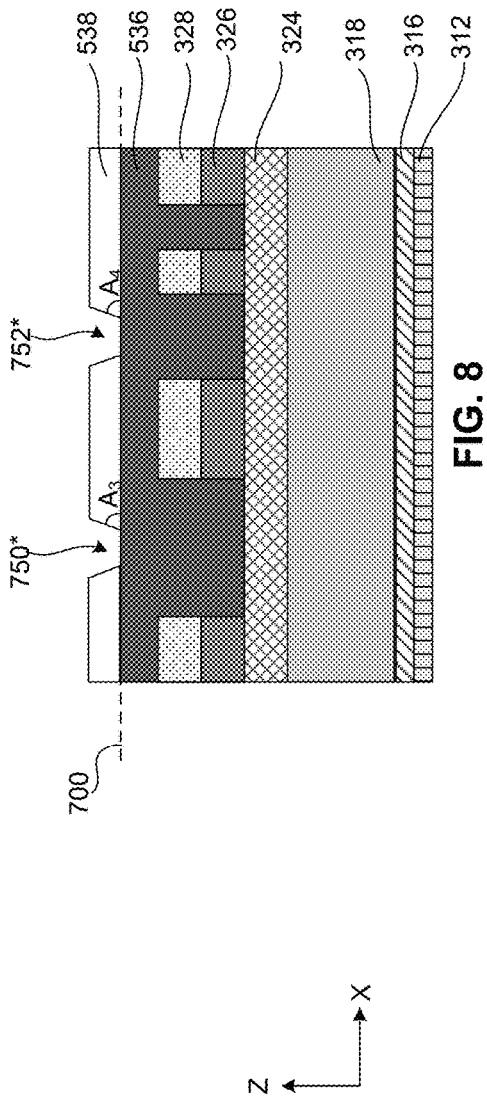
FIG. 8
FIG. 9

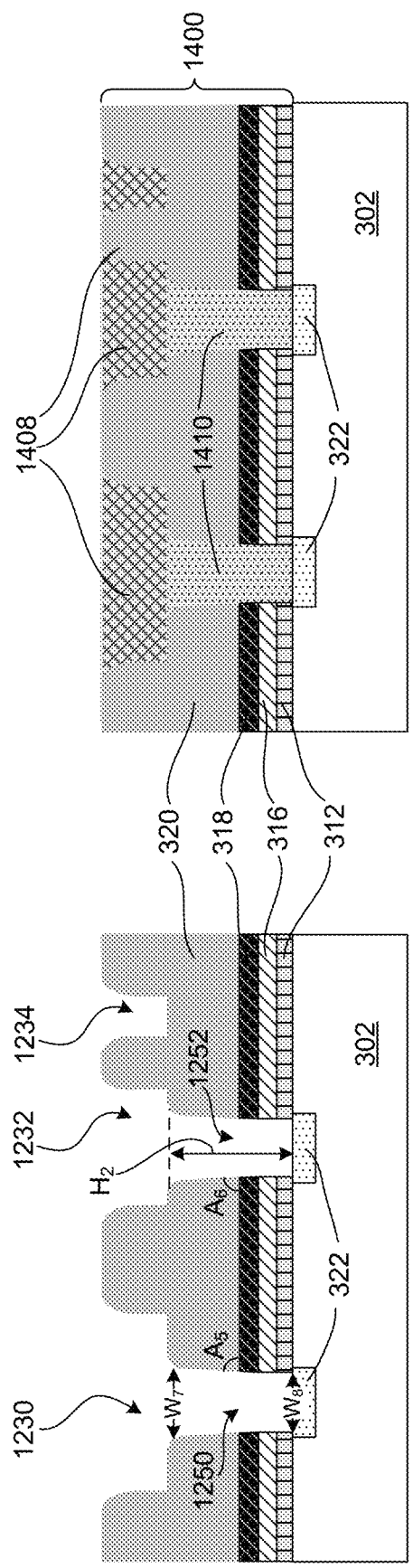
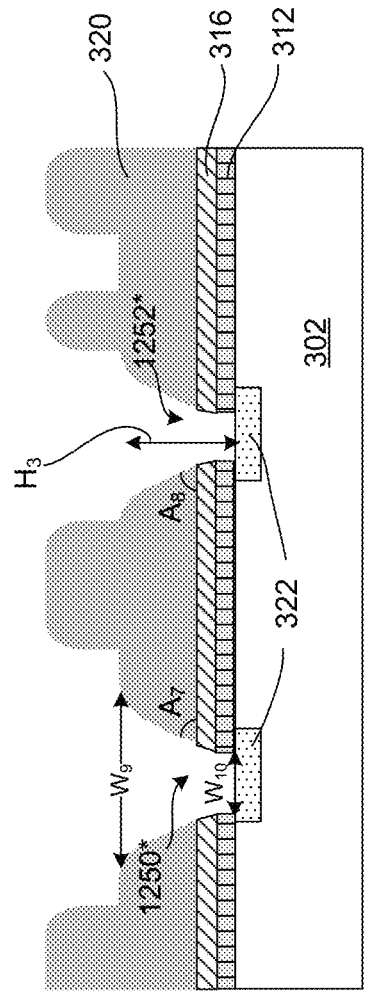
FIG. 12
FIG. 13
FIG. 14

ETCH PROFILE CONTROL OF INTERCONNECT STRUCTURES

CROSS-REFERENCE TO RELATED APPLICATIONS

This application is a continuation of U.S. Non-Provisional patent application Ser. No. 16/202,816, filed on Nov. 28, 2018 and titled "Etch Profile Control of Interconnect Structures," which is a divisional of U.S. Non-Provisional patent application Ser. No. 15/725,972, filed on Oct. 5, 2017 and titled "Etch Profile Control of Interconnect Structures," which claims the benefit of U.S. Provisional Patent Application No. 62/491,646, filed on Apr. 28, 2017 and titled "Etch Profile Control of Interconnect Structures." The entire contents of all applications are incorporated by reference herein in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3-7 are cross-sectional views of an integrated circuit at various stages of its fabrication process, in accordance with some embodiments.

FIG. 8 is a cross-sectional view of a partially-formed interconnect structure.

FIGS. 9-12 are cross-sectional views of an integrated circuit at various stages of its fabrication process, in accordance with some embodiments.

FIG. 13 is a cross-sectional view of a partially-formed interconnect structure.

FIG. 14 is a cross-sectional view of an integrated circuit, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
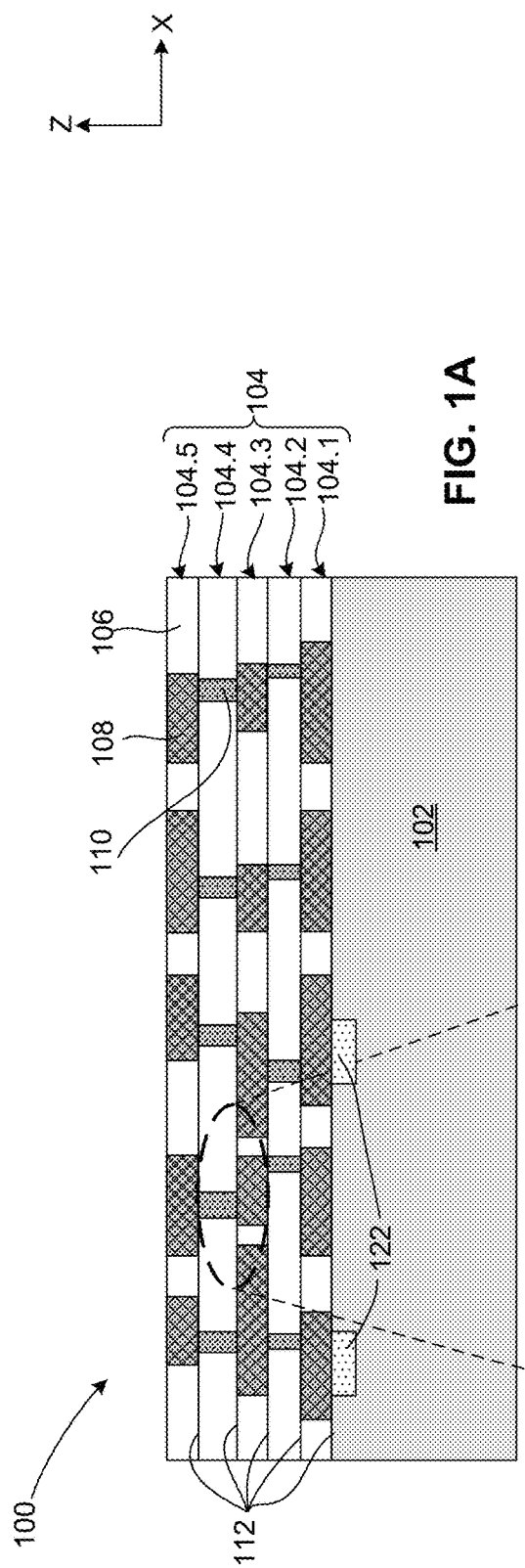
FIG. 1A is a cross-sectional view of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe an element or a feature's relationship to other element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is to be understood that the phraseology or terminology herein is for the purpose of description and not of limitation, such that the terminology or phraseology of the present specification is to be interpreted by those skilled in relevant art(s) in light of the present disclosure.

As used herein, the term "selectivity" refers to the ratio of the etch rates of two materials under the same etching conditions.

The term "about" as used herein indicates the value of a given quantity varies by ±10% of the value, unless noted otherwise.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example methods for improving etch profiles of back end of the line (BEOL) features, such as vias in interconnect structures fabricated in the BEOL process of integrated circuit (IC) fabrication. The example methods disclosed herein form vias with etch profiles more vertical and have smaller ratios between top and bottom openings of the vias compared to vias formed using other methods. These improved etch profiles of vias help prevent leakage and/or contact between the vias and metal lines in the interconnect structures and consequently improve performance of devices in the integrated circuit.

The IC fabrication process can divided into three stages: front end of the line (FEOL), middle of the line (MOL)/middle end of the line (MEOL), and back end of the line (BEOL). In the FEOL stage, functional devices such as, for example, field effect transistors (FETs) may be formed. In the MOL stage, low level interconnect structures such as, for example, source/drain contact structures and/or gate contact structures of FETs may be formed to electrically connect the functional devices to high level interconnect structures formed in the BEOL stage.

The high level interconnect structures may provide electrical connection between functional devices and/or elements of the IC formed in the FEOL stage. In the BEOL stage, the high level interconnect structures may be formed in an interlayer dielectric (ILD) layer that may be deposited over the IC structure after the MOL stage. The high level interconnect structure may include two types of conductive structures: vertical interconnect structures (also referred as "conductive vias" or "vias") and lateral interconnect structures (also referred as "metal lines"). The conductive vias may run through the BEOL ILD layer in a vertical direction and may create electrical connections to layers above or below the BEOL ILD layer. Metal lines may run through the ILD layer in a lateral direction and may connect components within the BEOL ILD layer. The high level interconnect structure may include multiple layers of conductive vias and metals lines within the BEOL ILD. Each of these multiple layers may be separated from adjacent layers by an etch stop layer except for regions with electrical connections between adjacent layers.

FIG. 1A is a cross-sectional view of an integrated circuit (IC) 100 after the BEOL stage, according to some embodiments. IC 100 may include a substrate 102 and an interconnect structure 104. In some embodiments, substrate 102 may represent one or more functional devices formed in the FEOL stage. The functional devices may have contact structures 122 that may be formed in the MOL stage. In some embodiments, interconnect structure 104 may include layers 104.1 through 104.5. Each of layer 104.1 through 104.5 may include an ILD layer 106, conductive vias 110, and metal lines 108. Conductive vias 110 and metal lines 108 may be configured to provide electrical connection between the functional devices of substrate 102 formed in the FEOL stage.

Figure 1C:
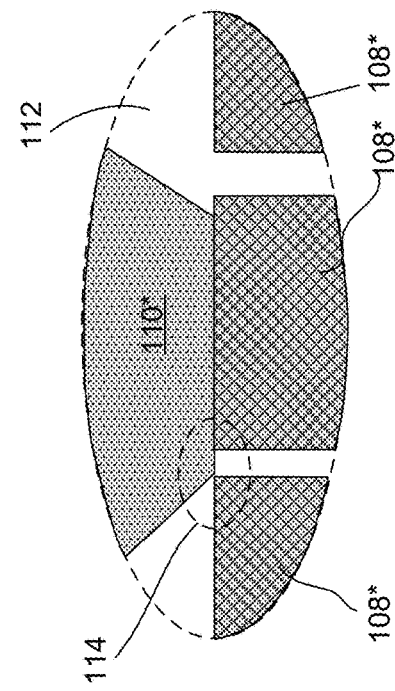
FIG. 1C is a cross-sectional view of an interconnect structure.
Figure 1B:
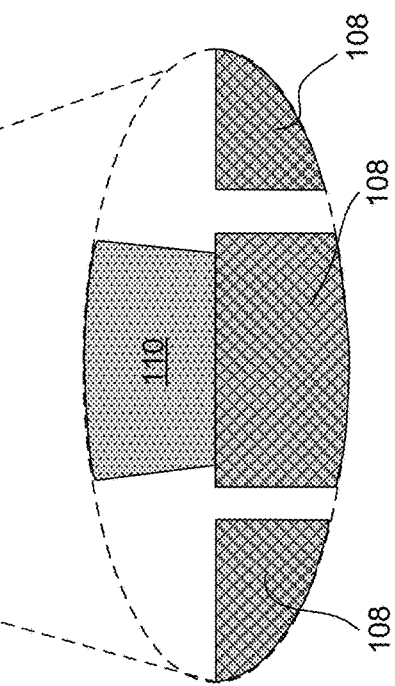
FIG. 1B is a cross-sectional view of an interconnect structure, in accordance with some embodiments.

FIG. 1B is a cross-sectional view of a portion of interconnect structure 100, according to some embodiments. As shown in FIG. 1B, conductive via 110 may have a substantially vertical profile. The embodiments below describe methods of achieving such vertical via profiles to prevent leakage and/or contact between conductive vias and metal line when via profiles are tapered as shown in FIG. 1C. Conductive via 110* may be formed other ICs using other methods. Due to the tapered profile of conductive via 110*, conductive via 110* may short with metal line 108* within region 114 and consequently have a negative impact on the performance of devices in integrated circuits.

FIG. 14 shows a cross-sectional view of an interconnect structure 1400 having conductive vias 1410, according to some embodiments. Conductive vias 1410 may have profiles similar to the substantially vertical profiles of conductive vias 110 discussed above with reference to FIGS. 1A and 1B.

Figure 2:
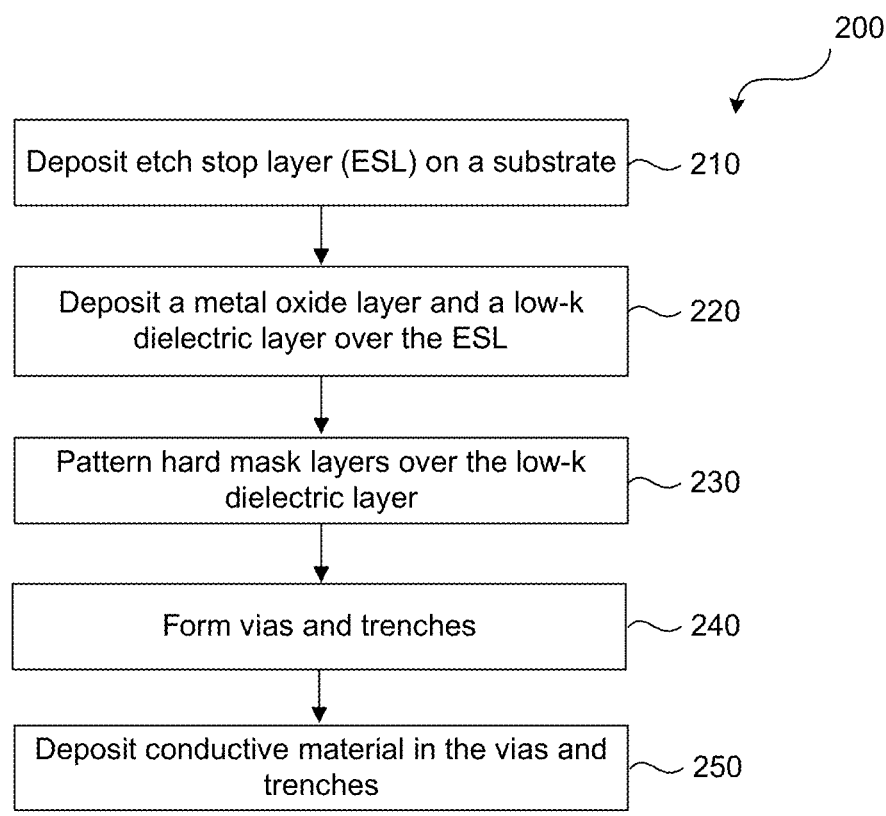
FIG. 2 is flow diagram of a method for fabricating an interconnect structure, in accordance with some embodiments.

FIG. 2 is a flow diagram of an example method 200 for fabricating an interconnect structure 1400, shown in FIG. 14, according to some embodiments. Operations can be performed in a different order or not performed depending on specific applications. It should be noted that method 200 does not produce a complete interconnect structure such as the structure shown in FIG. 14. Accordingly, it is understood that additional processes may be provided before, during, and/or after method 200, and that some of the processes are briefly described herein.

For illustrative purposes, the operations illustrated in FIG. 2 will be described with reference to the example fabrication process illustrated in FIGS. 3-7, 10-12, and 14. FIGS. 3-7, 10-12, and 14 are cross-sectional views of interconnect structure 1400 at various stages of its fabrication, according to some embodiments. A person of ordinary skill in the art will recognize that the views in FIGS. 3-7, 10-12, and 14 are shown for illustration purposes and may not be drawn to scale. According to some embodiments, interconnect structure 1400 may represent a portion of interconnect structure 104 discussed with reference to FIG. 1A. The above discussion of interconnect structure 104 and its conductive vias 110, metal lines 108, ILD layer 106, and ESL 112 applies to the following discussions of conductive vias, metal lines, ILD layer, and ESL with reference to FIGS. 2-7, 10-12, and 14.

In operation 210, an etch stop layer (ESL) is deposited on a substrate. For example, as shown in FIG. 3, ESL 312 may be deposited on substrate 302. In some embodiments, substrate 302 may represent a layer of a high level interconnect structure having metal lines 322 to which conductive vias 1410 of interconnect structure 1400 (shown in FIG. 14) may be electrically connected. In some embodiments, substrate 302 may represent one or more functional devices formed in the FEOL stage. The functional devices may have contact structures 322, formed in the MOL stage, to which conductive vias 1410 of interconnect structure 1400 may be electrically connected. In some embodiments, substrate 302 may represent a semiconductor material such as, but not limited to, silicon having conductive structures 322 to which conductive vias 1410 of interconnect structure 1400 may be electrically connected.

In some embodiments, substrate 302 may include a crystalline silicon substrate (e.g., wafer). In some embodiments, substrate 302 may include (i) an elementary semiconductor such as, for example, germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 302 may be doped depending on design requirements (e.g., p-type substrate or n-type substrate). In some embodiments, substrate 302 may be doped with p-type dopants (e.g., boron, indium, aluminum, or gallium) or n-type dopants (e.g., phosphorus or arsenic). Based on the disclosure herein, a person of ordinary skill in the art will recognize that other materials for substrate 302 are within the scope and spirit of this disclosure.

In some embodiments, conductive structures 322 may include a suitable conductive material such as, for example, Ti (titanium), tungsten (W), copper (Cu), cobalt (Co), nickel (Ni), silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), titanium carbide (TiC), titanium aluminum carbide (TiAlC), tantalum aluminum carbide (TaAlC), metal alloys, and/or combinations thereof. Based on the disclosure herein, a person of ordinary skill in the art will recognize that other materials for conductive structures 322 are within the scope and spirit of this disclosure.

ESL 312 may be configured to protect substrate 302 and conductive structures 322 during, for example, formation of interconnect structure 1400. In some embodiments, ESL 312 may include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 312 may include silicon nitride or silicon oxide formed by low pressure chemical vapor deposition (LPCVD), plasma enhanced chemical vapor deposition (PECVD), chemical vapor deposition (CVD), atomic layer deposition (ALD), or silicon oxide formed by a high-aspect-ratio process (HARP). In some embodiments, ESL 312 may have a thickness $312t$ in a range from about 1 nm to 3 nm. Based on the disclosure herein, a person of ordinary skill in the art will recognize that other materials, formation methods, and thicknesses for ESL 312 are within the scope and spirit of this disclosure.

In some embodiments, a liner 316 having oxygen doped carbide material may be deposited on ESL 312. In some embodiments, liner 316 has a thickness $316t$ in a range from about 3 nm to about 8 nm and may be used as another etch stop layer. In some embodiments, liner 316 may be formed by LPCVD, PECVD, or CVD.

In referring to FIG. 2, in operation 220, a metal oxide layer and an interlayer dielectric (ILD) layer is deposited over the ESL. For example, as shown in FIG. 3, a metal oxide layer 318 may be deposited on liner 316, followed by a deposition of an ILD layer 320 on metal oxide layer 318. Metal oxide layer 318 may help improve the etch profile of the vias as will be discussed in further detail below. In some embodiments, metal oxide layer 318 may include oxides of a suitable metal such as, for example, chromium (Cr), Al, Ti, tin (Sn), zinc (Zn), magnesium (Mg), silver (Ag), Ni, Mo, or a combination thereof. Metal oxide layer 318 may be deposited using a suitable metal oxide deposition process such as, for example CVD.

In some embodiments, a layer having metal nitride or metal carbide may be used instead of metal oxide layer 318. In some embodiments, a stack of one or more layers having metal oxide, metal nitride, metal carbide, or a combination thereof may be used in place of metal oxide layer 318 for the fabrication of interconnect structure 1400 (shown in FIG. 14).

ILD layer 320 may be similar in structure and function to ILD layers 106 of interconnect structure 104 discussed above with reference to FIG. 1A. In some embodiments, ILD layer 320 may include a low-k dielectric material. Low-k materials may have a dielectric constant below 3.9. Low-k materials in ILD layer 320 may help reduce unwanted parasitic capacitances and minimize resistance-capacitance (RC) delays. In some embodiments, ILD layer 320 may be formed by a suitable dielectric deposition process such as, for example, CVD or ALD. ILD layer 320 may have a thickness $320t$ in a range from about 90 nm to about 150 nm. ILD layer 320 may help provide electrical isolation between adjacent conductive vias 1410 and/or adjacent metal lines 1408 of interconnect structure 1400 that may be formed in ILD layer 320. Conductive vias 1410 may run vertically along, for example, Z-axis in ILD layer 320 and metal lines 1408 may run laterally along, for example, Y-axis in ILD layer 320.

As shown in FIG. 3, the deposition of ILD layer 320 may be followed by a deposition of a stack of masking layers. The stack of masking layers may include a nitrogen free anti-reflective layer (NFARL) 324, a first hard mask layer 326, and a second hard mask layer 328. NFARL 324 may help protect ILD layer 320 during subsequent patterning of first and second hard mask layers 326 and 328. The patterning of first and second hard mask layers 326 and 328 may involve chlorine based processes that may etch ILD layer 320 if not protected by a masking layer such as, for example, NFARL 324. In some embodiments, NFARL 324 may include a dielectric material and may be formed using a suitable deposition method such as, for example, CVD. In some embodiments, a gas mixture including silane and carbon dioxide may be used in the deposition of NFARL 324. NFARL may have a thickness $324t$ in a range from about 20 nm to about 30 nm.

In some embodiments, first hard mask layer 326 may be deposited using, for example, PVD and may include silicon nitride, titanium nitride, or a combination thereof. First hard mask layer 326 may have a thickness $326t$ in a range from about 25 nm to about 40 nm. Second hard mask layer 328 may include tetraethoxysilane (TEOS) formed by, for example, CVD, according to some embodiments. Second hard mask layer 328 may have a thickness $328t$ in a range from about 25 nm to about 40 nm.

In referring to FIG. 2, in operation 230, hard mask layers over the ILD layer are patterned. For example, as shown in FIG. 4, first and second hard mask layers 326 and 328 may be patterned to form trench etch openings 430, 432, and 434. These trench etch openings may define the areas for the formation of subsequent trenches in ILD layer 320. These trenches may subsequently form metal lines 1408 of interconnect structure 1400 (FIG. 14) as described in further detail below. The widths $W_1$, $W_2$, and $W_3$ of respective trench etch openings 430, 432, and 434 may define the widths of trenches formed in ILD layer 320 in subsequent processing. Patterning of first and second hard mask layers 326 and 328 may be performed by photolithography and a dry etching process. In some embodiments, the dry etch process may be chlorine based process.

In referring to FIG. 2, in operation 240, vias and trenches are formed in the ILD layer. For example, as shown through FIGS. 5-7 and 9-12, vias 1250 and 1252 and trenches 1230, 1232, and 1234 may be formed in ILD layer 320. In some embodiments, as shown in FIG. 5, a stack of layers may be deposited on the structure of FIG. 4. The stack of layers may include first and second organic layers 536 and 544, a low temperature oxide (LTO) layer 538, first and second Si-based layers 540 and 546, a capping layer 542, and a photoresist layer 548. Each of these layers of the stack of layers may be arranged in the order shown in FIG. 5, according to some embodiments. This stack of layers may help form via etch openings 650, 652, 750, and 752 (as shown in FIGS. 6-7) that may define the areas for subsequent formation of vias 1250 and 1252 (shown in FIG. 12) in ILD layer 320. This stack of layers may also help control the etch profiles of vias 1250 and 1252 during their formation.

In some embodiments, first and second organic layers 536 and 544 may be formed in a similar process such as, for example, by spin coating a suitable polymer material on the structure of FIG. 4 and on capping layer 542, respectively, at a temperature ranging from about 100° C. to about 300° C. First and second organic layers may have a respective thickness 536t and 542t in a range from about 150 nm to about 300 nm.

LTO layer 538 may include silicon oxide formed by, for example, CVD using a gas mixture having silane and oxygen, according to some embodiments. LTO layer 538 may be deposited at a low temperature ranging from about 50° C. to about 200° C. LTO layer 538 may have a thickness 538t in a range from about 10 nm to about 30 nm.

First and second Si-based layers 540 and 546 may include different materials and may be formed in different deposition processes, according to some embodiments. First Si-based layer 540 may be formed by, for example, CVD or PVD using a gas mixture having elements of silicon, oxygen, and carbon. In some embodiments, first Si-based layer 540 may have a thickness 540t in a range from about 10 nm to about 30 nm. Second Si-based layer 546 may be deposited, for example, by spin-coating siloxane on second organic layer 544 at a temperature ranging from about 50° C. to about 200° C. In some embodiments, second Si-based layer 546 may have a thickness 546t in a range from about 30 nm to about 40 nm. In some embodiments, first and second Si-based layers 540 and 546 may include same material.

In some embodiments, capping layer 542 may include silicon oxide formed by, for example, CVD using a gas mixture having silane and oxygen at a temperature ranging from about 200° C. to about 500° C. Capping layer 542 may have a thickness 542t in a range from about 30 nm to about 40 nm.

Following the deposition of the stack of layers on the structure of FIG. 4, photoresist layer 548 may be patterned to form a first pair of via etch openings 650 and 652 as shown in FIG. 6. This formation is followed by one or more etching processes to etch second Si-based layer 546 and second organic layer 544 through first pair of via etch openings 650 and 652 to form a second pair of via etch openings 750 and 752 as shown in FIG. 7. In some embodiments, second Si-based layer 546 may be etched in a dry etch process (e.g., reactive ion etching process) using a gas mixture having fluorocarbon ($C_xF_y$), nitrogen, and argon. The gas mixture may have about 10% to about 70% $C_xF_y$. The flow rate of $C_xF_y$ may range from about 100 sccm to about 400 sccm and the flow rate of nitrogen and argon may range from about 50 sccm to about 300 sccm. The etch process may be carried out for a period of time ranging from about 10 sec to about 90 sec at a temperature ranging from about 10° C. to about 90° C., under a pressure ranging from about 15 mTorr to about 100 mTorr.

In some embodiments, second organic layer 544 may be etched in a dry etch process (e.g., reactive ion etching process) using a gas mixture having hydrogen, nitrogen, and argon. The gas mixture may have about 5% to about 20% hydrogen. The flow rate of hydrogen may range from about 20 sccm to about 100 sccm and the flow rate of nitrogen and argon may range from about 100 sccm to about 400 sccm. The etch process may be carried out for a period of time ranging from about 10 sec to about 90 sec at a temperature ranging from about 10° C. to about 90° C., under a pressure ranging from about 15 mTorr to about 100 mTorr.

After the etching of second Si-based layer 546 and second organic layer 544 through via etch openings 650 and 652, the patterns of via etch openings 650 and 652 may have transferred within second organic layer 544. Due to the presence of second Si-based layer 546, the widths of the transferred etched patterns (not shown) in second organic layer 544 may be smaller than widths 650w and 652w. This may be due to deposition of silicon fluoride based material on sidewalls of via etch openings (not shown) formed in second Si-based layer 546 during its etching process. And as a result, the widths of the via etch openings in second Si-based layer 546 through which second organic layer 544 is etched may be narrower than widths 650w and 652w. Thus, second Si-based layer 546 may help shrink the widths of subsequent vias 1250 and 1252 of FIG. 12 formed in ILD layer 320 compared to the widths of via etch openings 650 and 652 patterned in photoresist layer 548.

Following the etch of second organic layer 544, capping layer 542, first Si-based layer 540, and LTO layer 538 may be etched to form second pair of via etch openings 750 and 752, as shown in FIG. 7. In some embodiments, capping layer 542 may be etched in a dry etch process (e.g., reactive ion etching process) using $C_xF_y$ gas having a flow rate ranging from about 100 sccm to about 400 sccm. The etch process may be carried out for a period of time ranging from about 10 sec to about 90 sec at a temperature ranging from about 10° C. to about 90° C., under a pressure ranging from about 15 mTorr to about 100 mTorr. This etch process transfers the via etch openings (not shown) from second organic layer 544 to capping layer 542. During the etch of capping layer 542, second Si-based layer 546 and second organic layer 544 may be etched off from top surface of capping layer 542.

In some embodiments, the stack of layers of FIG. 5 discussed above may not include second organic layer 544 and second Si-based layer 546. Instead, photoresist layer 548 may be deposited on capping layer 542. In this embodiment, the etching of capping layer 542 may be followed by the formation of via etch opening 650 and 652.

First Si-based layer 540 and LTO layer 538 may be etched through the transferred via etch openings (not shown) in capping layer 542. In some embodiments, first Si-based layer 540 may be etched in a dry etch process (e.g., reactive ion etching process) using a gas mixture having $C_xH_yF_z$ gas, oxygen, nitrogen, and argon. The gas mixture may have about 5% to about 10% $C_xH_yF_z$ and about 1% to about 5% oxygen. The flow rates of $C_xH_yF_z$ may range from about 5 sccm to about 100 sccm, of oxygen may range from about 5 sccm to about 30 sccm, and of nitrogen and argon may range from about 50 sccm to about 300 sccm. The etch process may be carried out for a period of time ranging from about 10 sec to about 90 sec at a temperature ranging from about 10° C. to about 90° C., under a pressure ranging from about 15 mTorr to about 100 mTorr.

In some embodiments, LTO layer 538 may be etched in a dry etch process (e.g., reactive ion etching process) using a gas mixture having fluorocarbon ($C_xF_y$), nitrogen, and argon. The gas mixture may have about 1% to about 20% $C_xF_y$. The flow rates of $C_xF_y$ may range from about 10 sccm to about 30 sccm and of nitrogen and argon may range from about 600 sccm to about 1500 sccm. The etch process may be carried out for a period of time ranging from about 10 sec to about 90 sec at a temperature ranging from about 10° C. to about 90° C., under a pressure ranging from about 15 mTorr to about 100 mTorr.

As shown in FIG. 7, during the etch of first Si-based layer 540 and LTO layer 538, capping layer 542 may be etched off from top surface of first Si-based layer 540. Widths 750$w$ and 752$w$ of second pair of via etch openings 750 and 752 may be narrower than widths 650$w$ and 652$w$ because of narrower widths of the transferred via etch openings in second organic layer 544, as discussed above.

Presence of capping layer 542 may help achieve substantially vertical etch profiles in via etch openings 750 and 752 compared to etch profiles in via etch openings 750* and 752* (as shown in FIG. 8) formed in a method without using a capping layer such as capping layer 542. Angles $A_1$ and $A_2$ in etch profiles of respective via etch openings 750 and 752 are larger than angles $A_3$ and $A_4$ in etch profiles of respective via etch openings 750* and 752*. In some embodiments, $A_1$ and $A_2$ may be in a range from about 83° to about 90°, and $A_3$ and $A_4$ may be in a range from about 65° to about 70°. Angles $A_1$ and $A_2$ may be the angles between the respective sidewalls of via etch openings 750 and 752 and X-axis. Angles $A_3$ and $A_4$ may be the angles between the respective sidewalls of via etch openings 750* and 752* and X-axis. Hence, substantially vertical etch profiles of via etch openings 750 and 752 may be achieved with the help of capping layer 542 because capping layer 542 helps protect first Si-based layer 540 on LTO layer 538 during their etch processes. First Si-based layer 540 helps prevent over etching of LTO layer 538 in the lateral direction (e.g., X-direction). As shown in FIG. 8, first Si-based layer 540 is etched off during formation of via etch openings 750* and 752* in LTO layer 538.

Achieving substantially vertical etch profiles in via etch openings may result in similar etch profiles of vias 1250 and 1252 (FIG. 14) subsequently formed in ILD layer 320. As discussed above, substantially vertical etch profiles of vias may help prevent leakage and/or contact between the vias and metal lines in interconnect structures.

The formation of via etch openings 750 and 752 may be used to form partial vias 950 and 952 in ILD layer 320 as shown in FIG. 9. These partial vias 950 and 952 may be formed after etching first organic layer 536, NFARL layer 324 and ILD layer 320 through via etch openings 750 and 752. In some embodiments, first organic layer 536 may be etched in a process similar to the etching process of second organic layer 544. During this etching process, via etch openings (not shown) having similar profiles as via etch openings 750 and 752 may be formed in first organic layer 536 and first Si-based layer 540. LTO layer 538 may be etched off the top surface of first organic layer 536 during this etching process.

NFARL layer 324 and ILD layer 320 are then etched through the via etch openings formed in first organic layer 536. In some embodiments, NFARL layer 324 and ILD layer 320 may be etched in a dry etch process (e.g., reactive ion etching process) using a gas mixture having $C_xF_y$ gas, oxygen, nitrogen, and argon. The gas mixture may have about 5% to about 10% $C_xF_y$, and about 1% to about 5% oxygen. The flow rates of $C_xF_y$ may range from about 10 sccm to about 60 sccm, of oxygen may range from about 5 sccm to about 30 sccm, and of nitrogen and argon may range from about 5 sccm to about 1000 sccm. The etch process may be carried out for a period of time ranging from about 10 sec to about 90 sec at a temperature ranging from about 10° C. to about 90° C., under a pressure ranging from about 15 mTorr to about 100 mTorr.

Figures 10, 11:
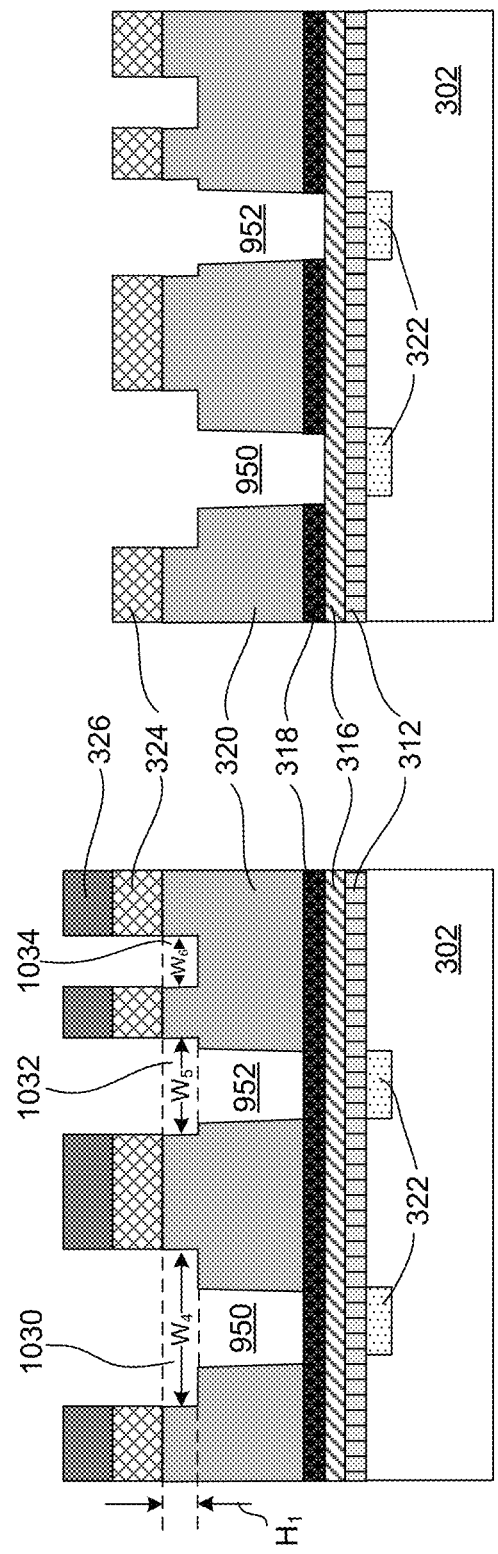

After the formation of partial vias 950 and 952, first organic layer 536 may be removed from the top surfaces of second hard mask layer 328 and NFARL 324. The removal of first organic layer 536 may be followed by continued etch of ILD layer 320 to extend partial vias 950 and 952 to the top surface of metal oxide layer 318, as shown in FIG. 10. During the continued etch of ILD layer 320, second hard mask layer 328 and NFARL layer 324 are etched to form partial trenches 1030, 1032, and 1034, as shown in FIG. 10. The widths $W_4$, $W_5$, and $W_6$ of respective partial trenches 1030, 1032, and 1034 may be defined by widths $W_1$, $W_2$, and $W_3$ of respective trench etch openings 430, 432, and 434 discussed above. In some embodiments, trench width $W_4$ may be in a range from about 85 nm to about 100 nm and trench height $H_1$ may be in a range from about 50 nm to about 80 nm.

In some embodiments, after the formation of partial trenches 1030, 1032, and 1034, first hard mask layer 326 and portions of metal oxide layer 318 exposed through partial vias 950 and 952 may be removed. The first mask layer 326 and the exposed portions of metal oxide layer 318 may be removed by, for example, a wet etching process using hydrogen peroxide at a temperature ranging from about 30° C. to about 100° C. The etch rate during this wet etch process may be in a range from about 0.2 nm/sec to about 0.5 nm/sec.

The removal of first mask layer 326 and the portions of metal oxide layer 318 may be followed by etching of remaining portions of NFARL 324 on ILD layer 320 and portions of liner 316 exposed through partial vias 950 and 952. Such etching may result in the formation of trenches 1230, 1232, and 1234 and vias 1250 and 1252 as shown in FIG. 12. In some embodiments, this etching may be performed in a dry etch process (e.g., reactive ion etching process) using a gas mixture having $C_xF_y$ gas, oxygen, carbon dioxide, nitrogen, and argon. The gas mixture may have about 1% to about 5% $C_xF_y$, about 1% to about 5% oxygen, and about 1% to about 5% carbon dioxide. The etch process may be carried out at a temperature ranging from about 20° C. to about 60° C., under a pressure ranging from about 15 mTorr to about 100 mTorr. In some embodiments, portions of ESL 312 may be etched to open vias 1250 and 1252 to conductive structures 322.

FIG. 13 shows tapered profiles of vias 1250* and 1252* formed in a method without using a metal oxide layer such as metal oxide layer 318. The presence of metal oxide layer 318 may help achieve the substantially vertical profiles of vias 1250 and 1252. Angles $A_5$ and $A_6$ in profiles of respective vias 1250 and 1252 are larger than angles $A_7$ and $A_8$ in profiles of respective vias 1250* and 1252*. In some embodiments, $A_5$ and $A_6$ may be in a range from about 70° to about 80°, and $A_7$ and $A_8$ may be in a range from about 50° to about 60°. Angles $A_5$ and $A_6$ may be angles between the respective sidewalls of vias 1250 and 1252 and X-axis.

Angles $A_7$ and $A_8$ may be the angles between the respective sidewalls of vias 1250\* and 1252\* and X-axis.

In some embodiments, via 1250 may have a top width $W_7$ to bottom width $W_8$ ratio in a range from about 2 to about 3 and via 1250\* may have a top width $W_9$ to bottom width $W_{10}$ ratio in a range from about 3 to about 4, which is larger than that of via 1250. In some embodiments, via 1250 may have a bottom width $W_8$ to height $H_2$ ratio in a range from about 45 to about 55 and via 1250\* may have a bottom width $W_{10}$ to height $H_3$ ratio in a range from about 55 to about 65, which is larger than that of via 1250. In some embodiments, via 1250 may have a height $H_2$ to top width $W_7$ ratio in a range from about 65 to about 75 and via 1250\* may have a height $H_3$ to top width $W_9$ ratio in a range from about 40 to about 50, which is smaller than that of via 1250. Hence, compared to the profile of via 1250, via 1250\* has a tapered via profile.

In referring to FIG. 2, in operation 250, conductive material is deposited in the vias and trenches to form conductive vias and metal lines. For example, as shown in FIG. 14, conductive vias 1410 and metal lines 1408 of interconnect structure 1400 are formed. Formation of conductive vias 1410 and metal lines 1408 may involve depositing conductive materials such as, for example, W, Al, Co, Cu, or a suitable conductive material in vias 1250 and 1252 and in trenches 1230, 1232, and 1234 using, for example, PVD, CVD, or ALD, according to some embodiments.

The above embodiments describe methods for achieving substantially vertical profiles of vias (e.g., vias 1250 and 1252) of interconnect structures (e.g., interconnect structure 1400). Achieving substantially vertical profiles of the vias may help prevent leakage and/or contact between the vias and metal lines in interconnect structures. In some embodiments, the use of an oxide capping layer (e.g., capping layer 542) during the formation of via etch openings (e.g., via etch openings 750 and 752) helps achieve substantially vertical etch profiles of the via etch openings, which in turn helps achieve substantially vertical profiles of the vias. In some embodiments, the presence of a metal oxide layer below the ILD layer of the interconnect structure helps form a substantially vertical profile of the vias compared to vias formed in method without using a metal oxide layer. For example, a via formed using a metal oxide layer in the interconnect structure can have a via profile sidewall that makes an angle with a horizontal axis in a range from about 70° to about 80°. This angle is larger than the angle made by a via profile sidewall of a via formed without a metal oxide layer, which can be in a range from about 50° to about 60°. Some of the embodiments are described below.

In some embodiments, a method of forming a semiconductor structure includes forming an etch stop layer on a substrate, forming a metal oxide layer over the etch stop layer and forming an interlayer dielectric (ILD) layer on the metal oxide layer. The method further includes forming a trench etch opening over the ILD layer, forming a capping layer over the trench etch opening, and forming a via etch opening over the capping layer.

In some embodiments, a method of forming an interconnect structure includes forming an etch stop layer on a substrate, forming a metal oxide layer over the etch stop layer, and forming an interlayer dielectric (ILD) layer on the metal oxide layer. The method further includes forming a low temperature oxide layer over the ILD layer, forming a capping layer over the low temperature oxide layer, and forming a via etch opening in the capping layer.

In some embodiments, a method of forming an interconnect structure includes forming an etch stop layer on a substrate, forming a metal oxide layer over the etch stop layer, and forming an interlayer dielectric (ILD) layer on the metal oxide layer. The method further includes forming a first conductive structure extending along a first direction in the ILD layer and forming a second conductive structure extending along a second direction in the ILD layer and in the metal oxide layer. The second direction is perpendicular to the first direction.

In some embodiments, an interconnect structure includes an etch stop on a substrate, a metal oxide layer positioned over the etch stop layer, an interlayer dielectric (ILD) layer positioned on the metal oxide layer, and a conductive structure in the ILD layer. The conductive structure is positioned in the metal oxide layer and in the etch stop layer.

In some embodiments, an integrated circuit includes a semiconductor device and an interconnect structure. The semiconductor device includes contact structures and the interconnect structure is coupled to the contact structures. The interconnect structure includes an etch stop layer positioned over the semiconductor device, a metal oxide layer positioned over the etch stop layer, an interlayer dielectric (ILD) layer positioned on the metal oxide layer, and a conductive via positioned within the metal oxide layer and the ILD layer.

In some embodiments, a semiconductor structure includes an etch stop layer positioned over a substrate, a metal oxide layer positioned over the etch stop layer, and an interlayer dielectric (ILD) layer positioned on the metal oxide layer. The semiconductor structure further includes a first conductive structure extending along a first direction in the ILD layer and a second conductive structure extending along a second direction in the ILD layer and in the metal oxide layer. The second direction is perpendicular to the first direction.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    patterning a first opening in a photoresist layer;
    etching, via the first opening, a first silicon-based layer and a first organic layer below the photoresist layer to form a second opening in the first organic layer while removing the photoresist layer and the first silicon-based layer; and
    etching, via the second opening, a capping layer, a second silicon-based layer, and a low temperature oxide (LTO) layer below the first organic layer to form a third opening in the second silicon-based layer and the LTO layer while removing the first organic layer and the capping layer, wherein the third opening exposes a portion of a second organic layer.

2. The method of claim 1, wherein the first silicon-based layer is formed by spin-coating siloxane on the first organic layer at a temperature between about 50° C. and about 200° C., and wherein etching the first silicon-based layer comprises etching the first silicon-based layer by a dry etch process using a gas mixture comprising fluorocarbon, nitrogen, and argon.

3. The method of claim 1, wherein the first organic layer is formed by spin-coating a polymer material on the capping layer at a temperature between about 100° C. and about 300° C., and wherein etching the first organic layer comprises etching the first organic layer by a dry etch process using a gas mixture comprising hydrogen, nitrogen, and argon.

4. The method of claim 1, wherein the capping layer is formed on the second silicon-based layer by a chemical vapor deposition (CVD) process using a gas mixture comprising silane and oxygen at a temperature between about 200° C. and about 500° C., and wherein etching the capping layer comprises etching the capping layer by a dry etch process using fluorocarbon gas having a flow rate between about 100 sccm and about 400 sccm.

5. The method of claim 1, wherein the second silicon-based layer is formed on the LTO layer by one of a chemical vapor deposition (CVD) process and a physical vapor deposition (PVD) process using a gas mixture having elements of silicon, oxygen, and carbon, and wherein etching the second silicon-based layer comprises etching the second silicon-based layer by a dry etch process using a gas mixture comprising hydrofluorocarbon, oxygen, nitrogen, and argon.

6. The method of claim 1, wherein the LTO layer is formed on the second organic layer by a chemical vapor deposition (CVD) process using a gas mixture comprising silane and oxygen at a temperature between about 50° C. and about 200° C., and wherein etching the LTO layer comprises etching the LTO layer by a dry etch process using a gas mixture comprising between about 1% and about 20% fluorocarbon.

7. The method of claim 1, further comprising spin-coating a polymer material on a substrate at a temperature between about 100° C. and about 300° C. to form the second organic layer.

8. A method, comprising:
forming a first opening in a silicon-based layer and a low temperature oxide (LTO) layer;
etching, via the first opening, an organic layer below the LTO layer to form a second opening in the organic layer while removing the silicon-based layer and the LTO layer; and
etching, via the second opening, a nitrogen free anti-reflective layer (NFARL) and an interlayer dielectric (ILD) layer below the organic layer to form a third opening in the NFARL and the ILD layer while removing the organic layer.

9. The method of claim 8, wherein etching the organic layer comprises etching the organic layer by a dry etch process using a gas mixture comprising between about 5% and about 20% hydrogen, and wherein a flow rate of hydrogen is between about 20 sccm and about 100 sccm.

10. The method of claim 8, wherein the NFARL is formed on the LTO layer by a chemical vapor deposition (CVD) process using a gas mixture comprising silane and carbon dioxide, and wherein etching the NFARL comprises etching the NFARL by a dry etch process using a gas mixture comprising fluorocarbon, oxygen, nitrogen, and argon.

11. The method of claim 8, wherein the ILD layer is a low-k dielectric material formed on a substrate by one of a chemical vapor deposition (CVD) process and an atomic layer deposition (ALD) process, and wherein etching the ILD layer comprises etching the ILD layer by a dry etch process using a gas mixture comprising between about 5% and about 10% fluorocarbon.

12. A method, comprising:
forming, between adjacent hard mask stacks, a first opening in a nitrogen free anti-reflective layer (NFARL) and an interlayer dielectric (ILD) layer, wherein each of the hard mask stacks comprises a first hard mask layer and a second hard mask layer;
etching, via the first opening, the NFARL and the ILD layer exposed outside the hard mask stacks to form a second opening in the ILD layer while removing the second hard mask layer;
etching, via the second opening, a metal oxide layer below the ILD layer to form a third opening in the ILD layer and the metal oxide layer while removing the first hard mask layer; and
etching, via the third opening, a liner and an etch stop layer (ESL) below the metal oxide layer to form a fourth opening in the ILD layer, the metal oxide layer, the liner, and the ESL while removing the NFARL, wherein the fourth opening exposes a portion of a conductive structure.

13. The method of claim 12, wherein the first hard mask layer comprises silicon nitride, titanium nitride, and combinations thereof, and wherein the second hard mask layer comprises tetraethoxysilane and is formed by a chemical vapor deposition (CVD) process.

14. The method of claim 12, wherein the hard mask stacks are formed by a photolithography patterning process and a chlorine based dry etch process.

15. The method of claim 12, wherein etching the NFARL and the ILD layer comprises etching the NFARL and the ILD layer by a dry etch process at a temperature between about 10° C. and about 90° C. and at a pressure between about 15 mTorr and about 100 mTorr.

16. The method of claim 12, wherein the metal oxide layer is formed on the liner by a chemical vapor deposition (CVD) process, and wherein etching the metal oxide layer comprises etching the metal oxide layer by a wet etch process using hydrogen peroxide at a temperature between about 30° C. and about 100° C.

17. The method of claim 12, wherein the liner comprises an oxygen doped carbide material and is formed on the ESL by one of a low pressure chemical vapor deposition (LPCVD) process, a plasma enhanced chemical vapor deposition (PECVD) process, and a chemical vapor deposition (CVD) process, and wherein etching the liner comprises etching the liner by a dry etch process using a gas mixture comprising fluorocarbon, oxygen, carbon dioxide, nitrogen, and argon.

18. The method of claim 12, wherein the ESL comprises silicon nitride, silicon oxide, and combinations thereof and is formed on the conductive structure by one of a low pressure chemical vapor deposition (LPCVD) process, a plasma enhanced chemical vapor deposition process, a chemical vapor deposition (CVD) process, an atomic layer deposition (ALD) process, and a high-aspect-ratio process (HARP), and wherein etching the ESL comprises etching the ESL by a dry etch process using a gas mixture comprising between about 1% and about 5% carbon dioxide.

19. The method of claim 12, further comprising forming the conductive structure on a substrate, wherein the conductive structure comprises a contact structure, a metal line, and combinations thereof.

20. The method of claim 12, further comprising forming an other conductive structure in the fourth opening, wherein the other conductive structure has a substantially vertical sidewall and is electrically coupled to the conductive structure.

\* \* \* \* \*